United States Patent
Ma

(10) Patent No.: US 7,602,109 B2
(45) Date of Patent: Oct. 13, 2009

(54) PLASMA DISPLAY DEVICE

(75) Inventor: Chia-Chu Ma, Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 824 days.

(21) Appl. No.: 11/161,206

(22) Filed: Jul. 27, 2005

(65) Prior Publication Data

US 2007/0001931 A1    Jan. 4, 2007

(30) Foreign Application Priority Data

Jul. 1, 2005    (TW) .............................. 94122270 A

(51) Int. Cl.
*H01J 17/49*    (2006.01)
(52) U.S. Cl. ...................... 313/46; 313/582
(58) Field of Classification Search ............ 313/46, 313/582–587; 315/169.4; 361/681, 688, 361/800, 831
See application file for complete search history.

(56) References Cited

U.S. PATENT DOCUMENTS

| | | | |
|---|---|---|---|
| 6,366,264 B1 | 4/2002 | Kurumada | |
| 6,522,543 B2 * | 2/2003 | Kurihara et al. ............. | 361/704 |
| 6,735,084 B1 | 5/2004 | Choi et al. ................... | 361/704 |
| 2004/0027069 A1* | 2/2004 | Kim et al. ................... | 313/582 |
| 2005/0078446 A1* | 4/2005 | Bae ............................ | 361/687 |
| 2005/0088092 A1 | 4/2005 | Kim et al. | |
| 2005/0088093 A1 | 4/2005 | Kim et al. | |
| 2005/0099106 A1* | 5/2005 | Kim et al. ................... | 313/46 |
| 2005/0110936 A1 | 5/2005 | Kim et al. | |
| 2005/0117283 A1* | 6/2005 | Lee et al. .................... | 361/681 |
| 2005/0117304 A1 | 6/2005 | Kim | |
| 2005/0286228 A1* | 12/2005 | Kim ........................... | 361/704 |
| 2006/0061945 A1* | 3/2006 | Kim ........................... | 361/681 |

FOREIGN PATENT DOCUMENTS

| | | |
|---|---|---|
| JP | 05-313184 | 11/1993 |
| JP | 06-342165 | 12/1994 |
| JP | 10-222076 | 8/1998 |
| JP | 10222076 | 8/1998 |
| JP | 11-251772 | 9/1999 |
| JP | 11251772 | 9/1999 |
| JP | 2001-352022 | 12/2001 |
| JP | 2004-126151 | 4/2004 |

* cited by examiner

*Primary Examiner*—Bumsuk Won
(74) *Attorney, Agent, or Firm*—Jianq Chyun IP Office

(57) ABSTRACT

A plasma display device comprises a plasma display panel, at least one driver IC package, a rear plate, a front frame, a heat-dissipated plate and a metal rear cover. The driver IC package is electrically connected with the plasma display panel. The front frame has a main body and a first protrusion extending backwards, and the driver IC package is disposed behind the main body and on the first protrusion. The rear plate is disposed behind the plasma display panel and is brought into contact with the driver IC package by virtue of a second protrusion of the rear plate. The heat-dissipated plate is disposed on the first protrusion and is brought into contact with the driver IC package. The metal rear cover is assembled to the front frame, and the heat-dissipated plate is brought into contact with the metal rear cover. In addition, the heat generated by the driver IC packages can be conducted to the metal rear cover, thereby reducing the working temperature of the driver chip package.

12 Claims, 3 Drawing Sheets

PLASMA DISPLAY DEVICE

CROSS-REFERENCE TO RELATED APPLICATION

This application claims the priority benefit of Taiwan application serial no. 94122270, filed Jul. 1, 2005. All disclosure of the Taiwan application is incorporated herein by reference.

BACKGROUND OF THE INVENTION

1. Field of the Invention

The present invention generally relates to a plasma display device, and more particularly to, a plasma display device with a heat-dissipated metal rear cover.

2. Description of Related Art

With current video technologies advance, a video device is gradually developed towards a trend of light-weight, reduced size and thinner panel. Flat panel display developed by combining optoelectronic and semiconductor manufacturing technologies, for example, such as liquid crystal display (LCD), organic light-emitting display (OLED), or plasma display panel (PDP) have become a main stream of display products. Among these display products, the plasma display panel has an excellent development potential because it has advantages including high brightness, wide view angle, non-radiation, free magnet-affected image and directly receiving digital signals.

When a plasma display device operates, an address side in the plasma display device requires a plurality of driver chip packages to control a switch of a current. Therefore, since the plurality of driver chip packages continuously and quickly perform switching between on/off, their working temperature approaches a high temperature of about 60~70° C. As a result, a life-span of the driver chip packages is reduced. Therefore, it is needed to dissipate the heat generated by the driver chip packages.

FIG. 1 shows a partial cross sectional view of a conventional display device. The conventional display device 100 comprises a front frame 110, a rear plate 120, a plasma display panel 130, a heat-dissipated plate 140 and a rear cover 150, as shown in FIG. 1. The front frame 110 has a protrusion 112, and the rear plate 120 is disposed on the protrusion 112 of the front frame 110. The plasma display panel 130 is disposed on the rear plate 120. The plasma display panel 130 includes a panel body 132 and at least one driver chip packages 134, wherein the panel body 132 is disposed between the front frame 110 and the rear plate 120. In addition, the driver chip packages 134 are used to control an operation of the panel body 132.

The heat-dissipated plate 140 is disposed between the rear plate 120 and the protrusion 112, and brought into contact with the driver chip packages 134. As a result, heat generated by the driver chip packages 134 can be conducted to the heat-dissipated plate 140. In addition, the rear cover 150 is arranged on the protrusion 112 of the front frame 110.

As a plasma display device with a high resolution develops, the driver chip packages' 134 working temperature is raised to 100° C. because the plasma display device with the high resolution exploits a single-sided scanning way. To lower the driver chip packages' 134 working temperature, a plurality of fins 142 is arranged on the heat-dissipated plate 140 to increase a heat-dissipated area. However, this type of heat-dissipated plate 140 not only increases cost but uneasily assembled into the conventional display device 100.

SUMMARY OF THE INVENTION

Accordingly, the present invention is directed to provide a plasma display device with a better heat-dissipated performance to reduce the driver chip packages' working temperature.

Based on the above objective and other objectives, a plasma display device of the present invention comprises a plasma display panel, at least one driver IC package, a rear plate, a front frame, a heat-dissipated plate and a metal rear cover. The driver IC package is electrically connected with the plasma display panel. The rear plate is disposed behind the plasma display panel and is connected with the driver IC package. The front frame has a main body and a first protrusion extending backwards, and the driver IC package is disposed behind the main body and on the first protrusion. The heat-dissipated plate is disposed on the first protrusion and is brought into contact with the driver IC package. The metal rear cover is assembled to the front frame, and the heat-dissipated plate is brought into contact with the metal rear cover. In addition, the heat generated by the driver IC packages can be conducted to the metal rear cover.

According to a preferred embodiment of the present invention, the rear plate comprises a second protrusion. Moreover, the heat-dissipated plate is disposed between the first protrusion and the second protrusion. In addition, the driver IC package may be disposed on the second protrusion of the rear plate.

According to a preferred embodiment of the present invention, the plasma display device further comprises a securing member for securing the metal rear cover and the heat-dissipated plate to the first protrusion. In addition, the securing member may be, for example, a screw.

According to a preferred embodiment of the present invention, the metal rear cover may comprises a plurality of heat-dissipated openings.

According to a preferred embodiment of the present invention, material of the metal rear cover may, for example, be chosen from one of a group consisted of alumina, alumina alloy, magnesium alloy and combinations thereof.

According to a preferred embodiment of the present invention, the rear plate comprises material, for example, metal. In addition, the metal may, for example, be chosen from one of a group consisted of alumina, alumina alloy, magnesium alloy and combinations thereof.

According to a preferred embodiment of the present invention, the driver IC package may be, for example, a tape carrier package (TCP).

According to a preferred embodiment of the present invention, the driver IC package may be, for example, a chip on film (COF) package.

According to a preferred embodiment of the present invention, the plasma display device may, for example, further comprise a heat-dissipated pad plate disposed between the heat-dissipated plate and the metal rear cover.

Based on the foregoing description, the present invention secures the metal rear cover and the heat-dissipated plate so that heat generated by the driver chip packages can be conducted to the metal rear cover through the heat-dissipated plate. As a result, the driver chip packages' working temperature can be effectively lowered and accordingly the performance of the plasma display device can be promoted.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
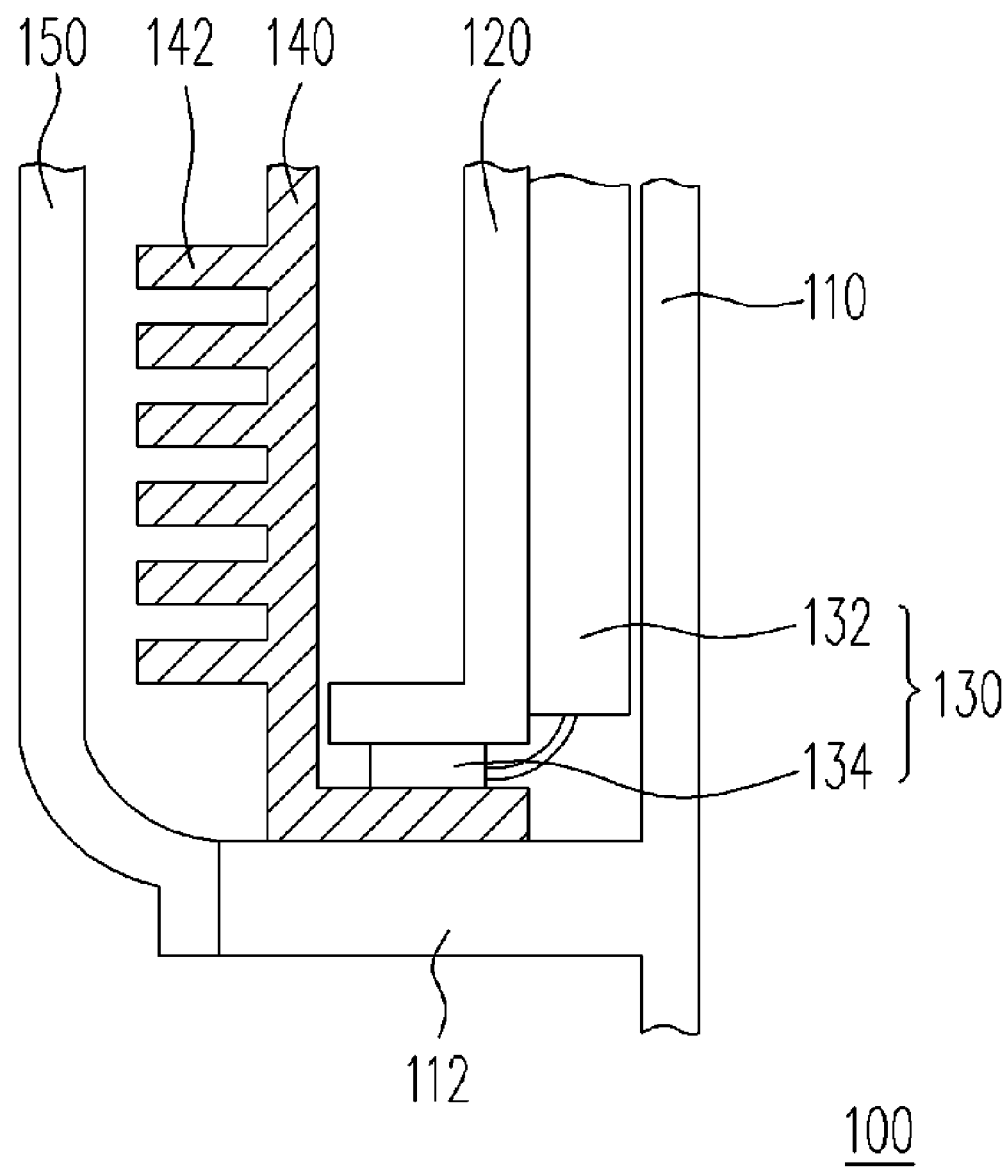
FIG. 1 is a partial cross sectional view of a conventional plasma display device.

Reference will now be made in detail to the present preferred embodiments of the invention, examples of which are illustrated in the accompanying drawings. Wherever possible, the same reference numbers are used in the drawings and the description to refer to the same parts.

Figure 2:
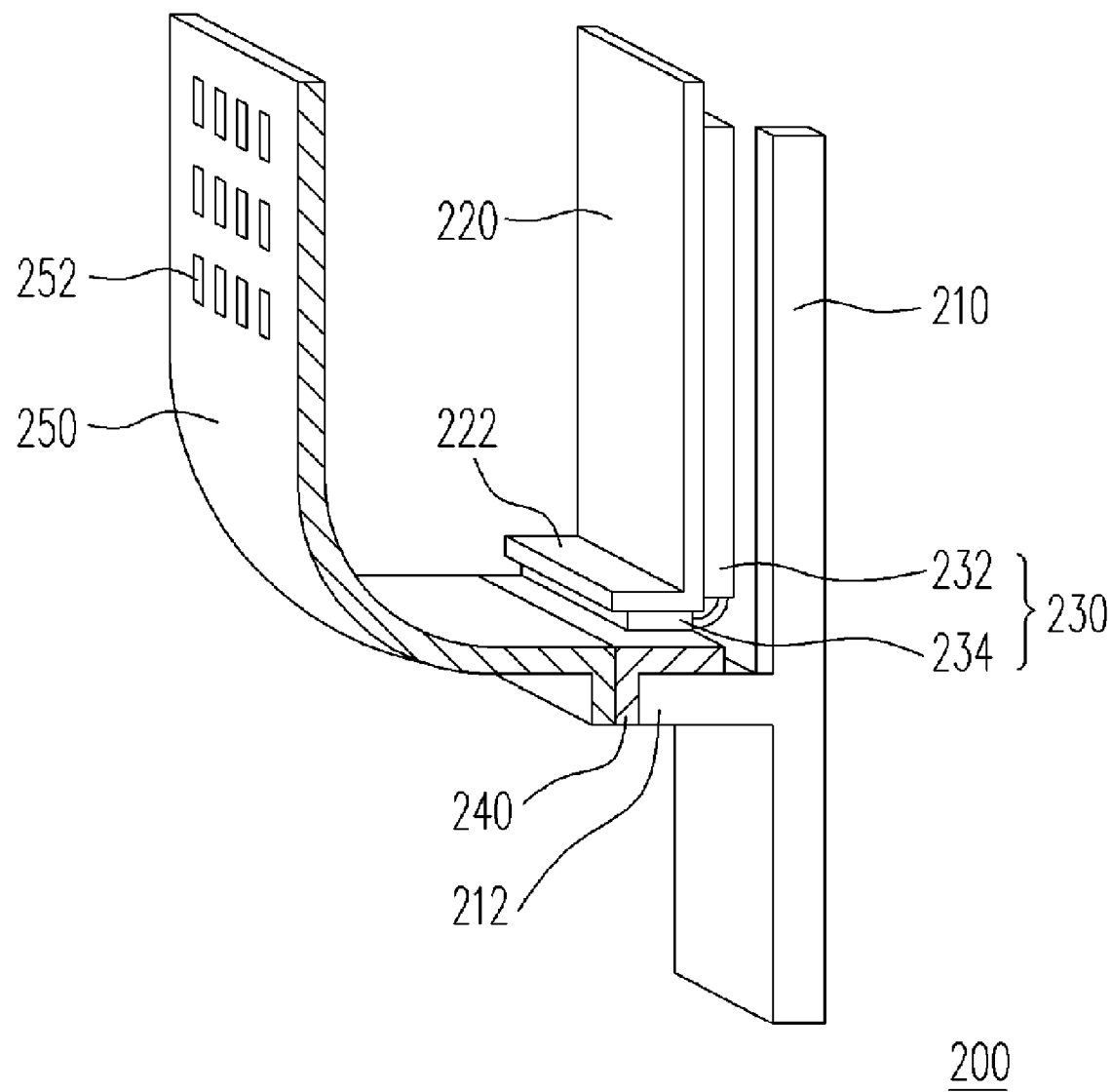
FIG. 2 is a partial cross sectional view of a plasma display device of one embodiment of the present invention.

FIG. 2 shows a partial cross sectional view of a plasma display device of one embodiment of the present invention. A plasma display device 200 comprises a plasma display panel 232, at least one driver IC package 234, a rear plate 220, a front frame 210, a heat-dissipated plate 240 and a metal rear cover 250, as shown in FIG. 2. Moreover, the driver IC packages 234 are electrically connected with the plasma display panel 232. In addition, the driver IC packages 234 are used to control an operation of the plasma display panel 232, and the driver IC packages 234 are tape carrier packages (TCP) or chip on film (COF) packages.

The rear plate 220 is disposed on the plasma display panel 232 and brought into contact with the driver IC packages 234. The rear plate comprises material, for example, metal. In addition, the metal may, for example, be chosen from one of a group consisted of alumina, alumina alloy, magnesium alloy and combinations thereof. In one embodiment, the rear plate 220 comprises a second protrusion 222, and the driver IC package 234 is disposed on the second protrusion 222. Therefore, when the rear plate 220 is metal, heat generated by the driver IC package 234 can partially conducted to the rear plate 220.

The front frame 210 comprises a main body 212 and a first protrusion 214 extending backwards. Moreover, the driver IC package 234 the rear plate 220 are disposed behind the main body 212 and on the first protrusion 214. Besides, material of the front frame 210 may be metal or plastic.

The heat-dissipated plate 240 is disposed on the first protrusion 214, and brought into contact with the driver IC packages 234 so that heat generated by the driver IC packages 234 can be conducted to the heat-dissipated plate 240. Moreover, material of the heat-dissipated plate 240 is metal.

Referring to FIG. 2, the metal rear cover 250 is assembled with the front frame 210 in such a manner that the heat-dissipated plate 240 is brought into contact with the metal rear cover 250 so as to heat generated by the driver IC package 234 can conducted to the metal rear cover 250. In this embodiment, screws are used to secure the metal rear cover 250 and the heat-dissipated plate 240 to the first protrusion 214 of the front frame 210. Alternatively, the metal rear cover 250 and the heat-dissipated plate 240 can be secured to the first protrusion 212 by using a technology of notch embedment, instead of screws. It is noticeable that this embodiment is not limited to any type of the heat-dissipated plate 240. One terminal of the heat-dissipated plate 240 must be brought into contact with the driver IC packages 234 while another terminal thereof is brought into contact with the metal rear cover 250. Therefore, heat generated by the driver IC packages 234 can be conducted to the metal rear cover 250 through the heat-dissipated plate 240. In addition, the metal rear cover 250 may comprises a plurality of heat-dissipated openings 252 to enhance performance of heat dissipation. In one embodiment, material of the metal rear cover 250 may, for example, be chosen from one of a group consisted of alumina, alumina alloy, magnesium alloy and combinations thereof.

In addition, the plasma display device 200 further comprises a heat-dissipated pad plate 260, disposed between the heat-dissipated plate 240 and the metal rear cover 250 to enhance the performance of heat-dissipation.

Since heat generated by the driver chip packages 234 is conducted to the metal rear cover 250 through the heat-dissipated plate 240, the whole heat-dissipated plate 240 can be regarded as one type of heat-dissipated plates to lower the driver chip packages' 234 working temperature. In other words, compared with the conventional technologies, the present invention has not only better performance but a low cost. The following describes the present invention's superiority over the conventional technologies.

TABLE 1

| | driver chip packages' working temperature (° C.) | | | | | | | | | |
|---|---|---|---|---|---|---|---|---|---|---|
| The invention | 76.2 | 78.65 | 80.3 | 75.5 | 71.6 | 74.85 | 79.4 | 75.45 | 76.65 | 73.35 |
| conventional technology | 87.1 | 86.5 | 90.75 | 85.15 | 85.35 | 87.25 | 88.65 | 82.4 | 85.2 | 79.95 |
| Temperature difference | 10.9 | 7.85 | 10.45 | 9.65 | 13.75 | 12.4 | 9.25 | 6.95 | 8.55 | 6.6 |

The table 1 shows a comparison between temperatures of the invention and those of the conventional technology. From the table 1, the conventional driver chip packages' working temperature is approximately between 80° C. to 90° C. while driver chip packages' working temperature of the invention is approximately between 73° C. to 80° C. Therefore, compared with the conventional technology, the driver chip packages' working temperature of the invention can be lowered about 6.6° C. to 13.75° C.

Figure 3:
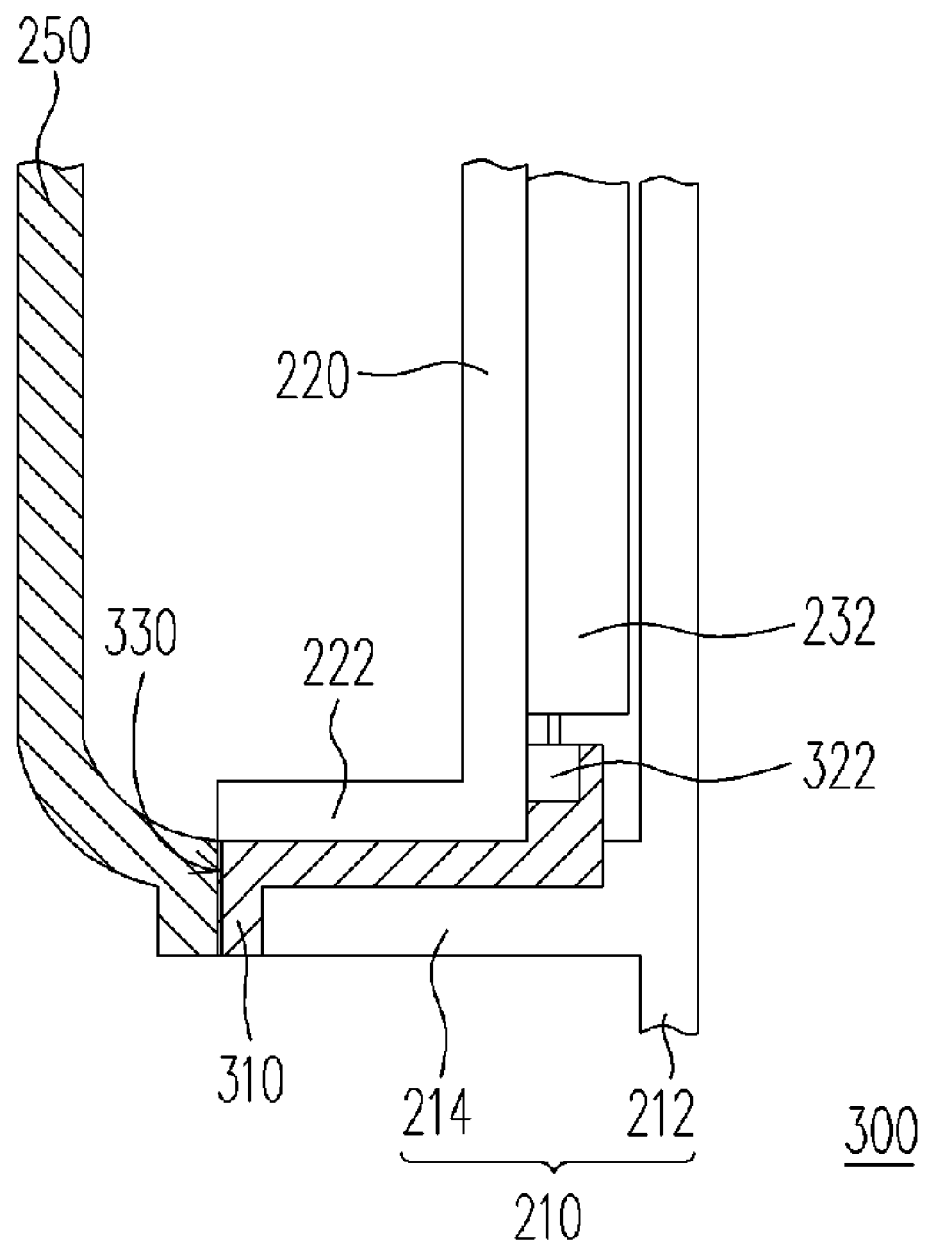
FIG. 3 is a partial cross sectional view of a plasma display device of another embodiment of the present invention.

FIG. 3 shows a partial cross sectional view of a plasma display device of another embodiment of the present invention. From FIG. 3, this embodiment is similar to the foregoing embodiment except that driver chip packages 322 is not limited to be arranged on the second protrusion 222 of the rear plate 220 because the tape carrier package is designed to be a flexible circuit board. In other words, an arrangement disposition of the driver chip packages 322 is more flexible in design.

In addition, heat generated by the driver chip packages 322 is conducted to the metal rear cover 250 by using a contact between a heat-dissipated plate with a proper shape and the driver chip packages 322. In one preferred embodiment, the plasma display device 300 may, for example, further comprise a heat-dissipated pad plate 330, disposed between the heat-dissipated plate 240 and the metal rear cover 250 to enhance the performance of heat-dissipation.

In summary, the plasma display device of the present invention has the following advantages:

1. Since heat generated by the driver chip packages 322 is conducted to the metal back cover through the heat-dissipated plate, the driver chip packages' working temperature can be lowered, thereby prolong their life-span. In addition, since heat generated by the driver chip packages 322 can be conducted to the metal rear cover, the driver chip packages with a higher efficiency and operating speed can be implemented into the present invention to promote display characteristics of the plasma display device.

2. Compared with the conventional technologies, the present invention can lower the driver chip packages' working temperature without using a heat-dissipated plate with a complicated shape so as to lower a manufacturing cost and difficulties in assembly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A plasma display device, comprising: a plasma display panel;
   at least one driver chip packages, electrically connected with the plasma display panel; a rear plate, disposed behind the plasma display panel and brought into contact with the at least one driver chip packages;
   a front frame, comprising a main body and a first protrusion extending backwards, wherein the at least one driver chip packages and the rear plate are disposed behind the main body and on the first protrusion;
   a heat-dissipated plate, disposed on the first protrusion and brought into contact with the at least one driver chip packages; and
   a metal rear cover, assembled with the front frame in such manner that the heat-dissipated plate is brought into contact with the metal rear cover so as to conduct heat generated by the at least one driver chip packages to the metal rear cover, wherein the at least one driver chip packages are located between and contacted with the rear plate and the heat dissipated plate.

2. The plasma display device according to claim 1, wherein the rear plate has a second protrusion and the heat-dissipated plate is disposed between the second protrusion and the first protrusion.

3. The plasma display device according to claim 2, wherein the at least one of driver chip packages are disposed on the second protrusion.

4. The plasma display device according to claim 1, further comprises a securing member for securing the metal rear cover and the heat-dissipated plate to the first protrusion.

5. The plasma display device according to claim 4, wherein the securing member comprises screws.

6. The plasma display device according to claim 1, wherein the metal rear cover has a plurality of heat-dissipated openings.

7. The plasma display device according to claim 1, wherein material of the metal rear cover is chosen from one of a group consisted of alumina, alumina alloy, magnesium alloy and combinations thereof.

8. The plasma display device according to claim 1, wherein material of the rear plate comprise metal.

9. The plasma display device according to claim 8, wherein the metal is chosen from one of a group consisted of alumina, alumina alloy, magnesium alloy and combinations thereof.

10. The plasma display device according to claim 1, wherein the at least one driver chip packages comprise tape carrier packages.

11. The plasma display device according to claim 1, wherein the at least one driver chip packages comprise chip on film packages.

12. The plasma display device according to claim 1, further comprises a heat-dissipated pad plate, disposed between the heat-dissipated plate and the metal rear cover.

* * * * *